United States Patent [19]

Ecker et al.

[11] Patent Number: 4,785,135
[45] Date of Patent: Nov. 15, 1988

[54] DE-COUPLED PRINTED CIRCUITS

[75] Inventors: Mario E. Ecker, Poughkeepsie; Leonard T. Olson, Endwell, both of N.Y.

[73] Assignee: International Business Machines Corporation, Armonk, N.Y.

[21] Appl. No.: 72,833

[22] Filed: Jul. 13, 1987

[51] Int. Cl.$^4$ .......................... H05K 1/00; H05K 3/00
[52] U.S. Cl. ....................................... 174/34; 29/829; 333/1; 333/238
[58] Field of Search ..................... 174/34; 333/1, 238; 29/829

[56] References Cited

U.S. PATENT DOCUMENTS

| | | | |
|---|---|---|---|
| 278,289 | 5/1883 | Strohm | 174/34 |
| 3,573,670 | 4/1971 | Skobern | 333/33 |
| 3,736,366 | 5/1973 | Witenberg | 174/34 |
| 3,761,842 | 9/1973 | Gandrud | 333/1 |
| 3,764,727 | 10/1973 | Balde | 174/34 |
| 3,774,123 | 11/1973 | Hume | 333/104 |
| 3,876,964 | 4/1975 | Balaster et al. | 333/238 |
| 4,076,357 | 2/1978 | Cistola | 439/65 |

FOREIGN PATENT DOCUMENTS

| | | | |
|---|---|---|---|
| 2709129 | 8/1978 | Fed. Rep. of Germany | 174/34 |
| 1402897 | 12/1965 | France | 174/34 |
| 913516 | 12/1962 | United Kingdom . | |

OTHER PUBLICATIONS

Berger, B. L. et al., "Printed Circuit Card Connector", IBM Tech. Disclosure Bulletin, vol. 11, No. 7, Dec. 1968, p. 723.
McDowell, J. J. et al., "Nonmechanical Connection Technique for High Speed, High Density Integrated Circuit Applications," IBM Tech. Disclosure Bulletin, vol. 10, No. 18, Jan. 1968, pp. 1223-1224.
Heath, C. A. et al., "Pulse Reflection Keyboard," IBM Tech. Disclosure Bulletin, vol. 16, No. 11, Apr. 1974, pp. 3649-3650.
Clouser, P. L., "Hybrid Microstrip Mixer and Circuits Constructed Therefrom," IBM Tech. Disclosure Bulletin, vol. 17, No. 6, Nov. 1974, pp. 1571-1572.
Hunt, R. L. et al., "Automatically Rerouting Wires on Printed-Circuit Boards to Avoid Noise Coupling Problems," IBM Tech. Disclosure Bulletin, vol. 18, No. 13, Aug. 1975, pp. 762-766.
Rabbat, N. B., "Reducing Crosstalk in Microstrip Lines," IBM Tech. Disclosure Bulletin, vol. 18, No. 5, Oct. 1975, pp. 1430-1435.
Clouser, P. L., "Microstrip Filter," IBM Tech. Disclosure Bulletin, vol. 18, No. 6, Nov. 1985, pp. 1810-1811.
McAllister, M. F. et al., "Coupled Noise Reduction Method," IBM Tech. Disclosure Bulletin, vol. 18, No. 8, Jan. 1976, p. 2526.
Ecker, M. E. et al., "Circuit Supporting Structure with Antiringing Characteristics," IBM Tech. Disclosure Bulletin, vol. 18, No. 11, Apr. 1976, pp. 3633-3634.

Primary Examiner—Morris H. Nimmo
Attorney, Agent, or Firm—Kenneth P. Johnson

[57] ABSTRACT

Arrangement for reducing cross talk between electrical circuit conductors wherein the conductors lie within individual parallel channels within the same plane or different parallel planes within the induced voltage or cross talk region of an energized and a quiet conductor and either converge or diverge with respect to each other. The amount of relative convergence or divergence, preferably mor than six degrees and less than 15 degrees, is that required to attenuate the magnitude of any signal induced by the activated conductor in a neighboring or quiet conductor to maintain an acceptable and desired signal-to-noise ratio.

15 Claims, 2 Drawing Sheets

DE-COUPLED PRINTED CIRCUITS

BACKGROUND OF THE INVENTION

This invention relates generally to the formation of "printed circuit conductors" and, more particularly, to the fabrication of such conductors in which the coupled noise or cross talk is unusually and severely attenuated.

Continual effort is being expended to form insulated substrates carrying circuit lines or conductors in greater numbers. This is accomplished with conductors having smaller cross sections and closer center-to-center spacing. And in multi-layer substrates, the number of layers of circuits increases per unit of thickness. As conductor density increases in the various levels of packaging, such as chip carriers, circuit cards and boards, the problem of coupled noise or cross talk among conductors assumes greater prominence. This noise results from the voltages induced in a quiet conductor by the switching of currents in other parallel, nearby energized conductors. The adversely affected conductors lie within a proximity region whose effective radius from an energized conductor varies with signal frequency, parasitic capacitance, inductance, source and termination impedance, dielectric constant, distance to ground and voltage plane, extent of conductor parallelism and other factors. As more conductors are placed within in a volume, the high frequency switching induces voltage levels that can be falsely detected as data, resulting in processing errors. These become particularly troublesome among digital circuits.

Since closely disposed conductors lying parallel to one another are subject to cross talk, whether in the same or adjacent planes, the interval of radial distance between neighboring conductors has a minimum value for a particular acceptable signal-to-noise ratio. This dimension is typically decreased by reducing conductor size to enlarge separation, decreasing dielectric constant of insulators, or placing ground reference planes nearby. Multi-layer substrates frequently limit the number of signal planes as opposed to supply planes, to two orthogonally arranged planes adjacent to a ground plane, as in microstrip structure. In a different arrangement, signal planes are grouped in four with conductors on adjacent signal planes orthogonally disposed and the group placed between a pair of ground planes. These additional ground reference planes add to the fabrication expense and alter the electrical parameters. Coupled noise becomes of even greater significance as operating voltage levels decrease and produce a lower signal-to-noise ratio. Although adjacent wiring planes may be orthogonally or diagonally arranged to decrease cross talk, there still remains the problem of coupled noise among adjacent, parallel conductors and the need of ground reference planes for each two signal planes.

Although coupled noise has been effectively reduced among discrete wires by using twisted pairs, planar, printed wiring still experiences small, error prone signal-to-noise ratios.

OBJECTS AND SUMMARY OF THE INVENTION

It is accordingly a primary object of this invention to provide an arrangement of closely adjacent electrical conductors having an unusually large reduction of coupled noise during energization of the proximate conductors.

Another important object of this invention is to decrease or eliminate parallelism among conductors on signal or multiple circuit planes to thereby achieve a substantial attentuation of induced coupling of electrical impulses among conductors.

Yet another important object of this invention is to provide an arrangement of electrical circuit conductors that permit denser packaging in multiple layer substrates, but that have significantly less cross coupling of signals among conductors when energized particularly in digital pulse circuits.

Still another object of this invention is to provide a method of constructing closely adjacent electrical conductors having little or no coupled noise among them.

The foregoing objects are attained in accordance with this invention by providing a substrate for supporting electrical conductors and, for those particular conductors lying within a region of mutual inductance, arranging them in parallel or common substrate channels to either continually or intermittently converge or diverge relative to each other as they progress along their assigned channels. Angle magnitude of relative convergence and divergence or skew is that magnitude necessary to restrict or attenuate the induced voltage levels to acceptable signal-to-noise ratios and typically is between six and fifteen degrees. When two or more insulated conductors are placed on a common substrate that is electrically insulated they can occupy a common channel as long as the required nonparallelism or limited parallelism is maintained.

This invention has a major advantage of improving performance by severely limiting the magnitude of voltage fluctuations in neighboring conductors induced from an activated or energized conductor. Although the relative convergence and divergence adds conductor length, such signal propagation delay is typically less than 5% and thus negligible and readily acceptable to obtain the beneficial reduction in coupled noise. This delay has an advantage of keeping the primary and induced signals out of synchronism. The technique of maintaining limited relative convergence and divergence allows conductors, such as printed circuits, to be formed with nearly the density in common use, even with the conductors confined to individual parallel paths or channels on a substrate. Thus, there is little or no adverse effect on wirability. The conductor arrangement also lends itself to construction of multiple layer circuit cards and panels and permits the same reduction of coupled noise when conductors are considered in planes taken at various angles through the panels. Conductors are formed on their substrates with the known techniques, such as photolithographic additive or subtractive formation or automatic placement of insulated wires.

The foregoing and other objects, features and advantages of the invention will be apparent from the following more particular description of preferred embodiments of the invention as illustrated in the accompanying drawing.

DESCRIPTION OF THE PREFERRED EMBODIMENTS

Figure 1:
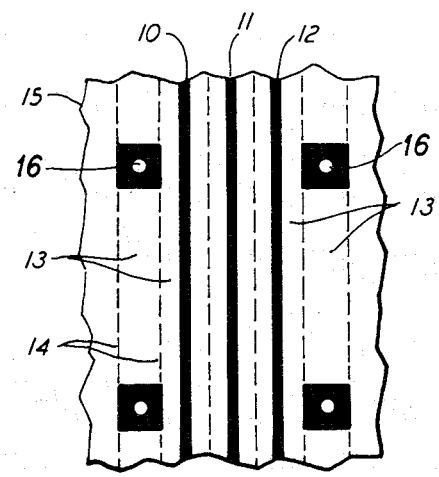
FIG. 1 is a plan view of printed wiring conductors typical of presently used circuit substrates or prior art.

Referring to FIG. 1, electrical signal conductors 10, 11 and 12 forming "printed circuits," are arranged in imaginary channels 13 defined by dashed lines 14 that include necessary spacing and are usually fabricated in close proximity on an insulative substrate 15. The substrate may have vias 16 and be a reinforced polymer such as glass fibers in epoxy or polyimide or other suitable material. The conductors are frequently copper and are arranged parallel to each other and may be formed by either additive or subtractive processes, or by embedding pre-insulated conductors in a semicured epoxy. They are placed as closely as possible to obtain maximum density but while maintaining a sufficient center-to-center distance to provide an acceptable signal-to-noise ratio for reliable, accurate recognition of changes in signal levels during operation. Conductor noise in an unenergized or quiet conductor appears as current disturbances induced from neighboring active conductors undergoing high frequency switching with pulses having fast rise times that produce electromagnetic variations due to parasitic capacitance and inductance. The influence primarily results from the frequency and parallel arrangement of the conductors in either the same or different planes, when close enough.

Figure 2:
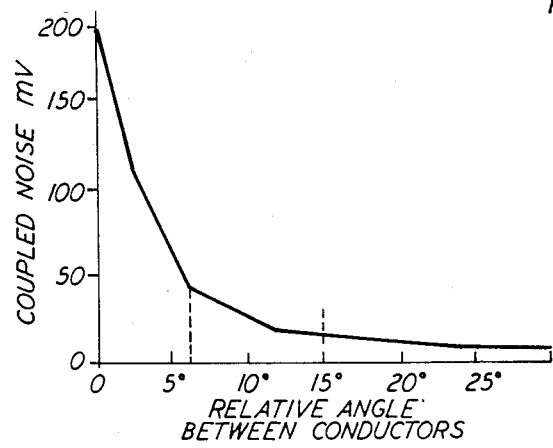
FIG. 2 is a plot of the magnitude of coupled noise versus the angle of relative convergence or divergence between adjacent conductors.

It has been discovered that the induced, coupled noise can be dramatically attenuated approximately 75–90 percent without orthogonal orientation merely by avoiding nearly all parallelism among the conductors and incorporating only small angles of relative convergence or divergence among those conductors lying within the parallel, imaginary channels and within the cross talk distance. Such convergence or divergence is extremely effective at small angles without the need of the usual orthogonal disposition and is illustrated in FIG. 2 where the magnitude of the induced coupled noise voltage is plotted versus the angle of skew or convergence or divergence between a quiet and an active conductor. It will be noted that a significant drop in coupled noise occurs within the first six degrees of departure from parallelism and that only a small, rather insignificant benefit occurs in angles increasingly larger than approximately fifteen degrees. This limited amount of convergence or divergence thus enables a significant and marked reduction in the level of coupled noise among adjacent or neighboring conductors. Because of this small amount of skew, conductors can be formed or placed on a substrate with nearly the same density as the parallel conductors.

Figure 3:
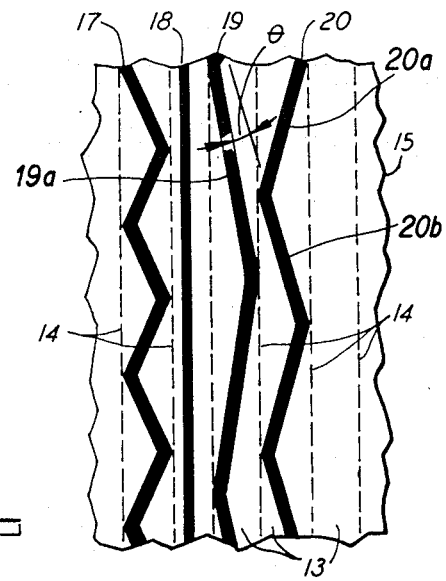
FIG. 3 is a plan view of a plurality of circuit conductors arranged on a substrate in accordance with the principles of the invention.

Examples of several conductor configurations are shown in FIG. 3. In this figure, imaginary assigned conductor channels 13, designated by broken lines 14 are arranged in the usual parallel manner over the surface of substrate 15. Each channel is reserved for one of the circuit conductors 17–20 that can be formed of a conductive metal by well-known processes that usually involve lithographic definition and either deposit or removal of metal, such as copper, aluminum or other suitable metal. Another technique is to partially embed already insulated conductors in a semicured polymer such as epoxy, then complete the curing.

Conductors 17–20 are formed during placement on substrate 15 such that there is an absence of parallelism in either convergence or divergence of the longitudinal axis of each conductor relative to those of the remaining conductors within the region of coupled noise. The angle $\theta$ of convergence or divergence, illustrated as divergence of the right hand edges of the conductor segments 19a and 20b in FIG. 3, is preferably at least 6 degrees and up to approximately 15 degrees. This arrangement reduces the magnitude of coupled noise or cross talk by an amount of more than 75% of that experienced by continuously parallel conductors. A conductor configuration can assume nearly any form within its assigned channel as long as there is the necessary minimum clearance from its neighboring conductors to avoid shorting. Configurations, such as those of conductors 17, 19 and 20, shown in FIG. 3, are, of course, longer than conductor 18 but the circuit path length typically increases 2.5% to 5% with negligable effect on the circuit propagation time because of relatively short runs. Construction of non-parallel conductors is confined to the same channel width required for parallel conductors while still achieving the necessary conductor skew and attenuation of cross talk.

Figure 4B:
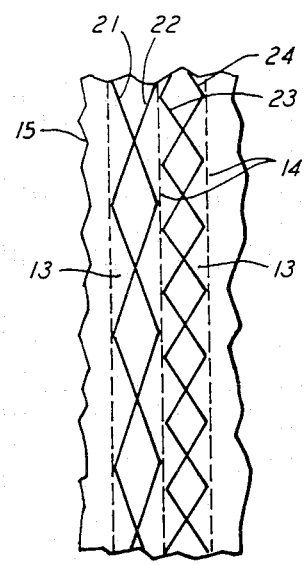
FIGS. 4a and 4b are plan and sectional views of a modification of the conductor arrangement of FIG. 1 showing conductor placement possible when using insulated conductors.
Figure 4A:
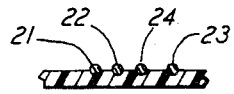

In FIGS. 4a and 4b channels 13 carry two insulated conductor pairs 21, 22 and 23, 24 in which the conductors overlie each other in zig-zag fashion on substrate 15. These conductors, being insulated wires, can be partially embedded in a semicured substrate surface by automatic machine wiring and achieve greater wiring density. It will be noted that, although the conductors in each channel pair use identical convergence and divergence angles with respect to the channel boundary, there is little parallelism. As an alternative, one wire of a pair can be axially offset along the common channel with respect to the other. Identity of convergence or divergence angles is not necessary. In the arrangement of FIGS. 4a and 4b, cross talk amplitude is still reduced by approximately the same amount because the extent of parallelism of conductor segments is minor.

Figure 5:
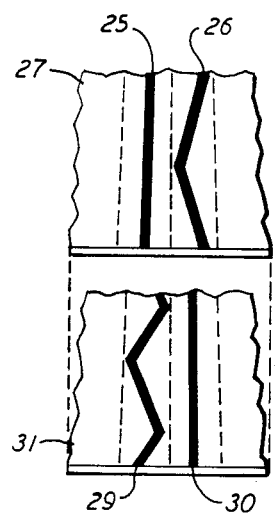
FIGS. 5 and 6 are exploded views of two and four wiring planes, respectively, of a multi-layer substrate illustrating conductor placement on respective adjacent layers and incorporating the principles of the invention.
Figure 6:
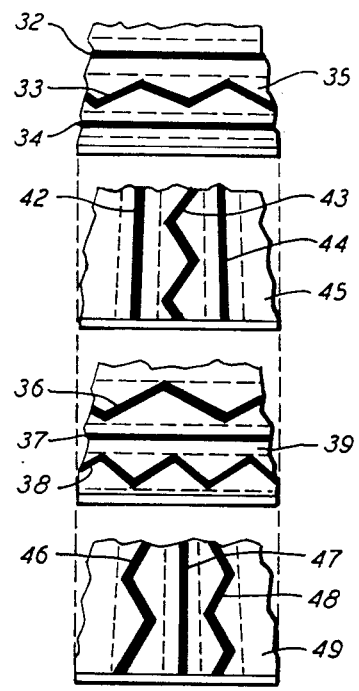

FIGS. 5 and 6 illustrate further conductor configurations that are suitable for multiple circuit layers and maintain relative convergence or divergence within the effective cross talk region. In FIG. 5, conductors 25 and 26 on substrate 27 will be assembled with conductors 29 and 30 on substrate 31 to form two circuit planes. Parallel conductors 25 and 30 are assumed to be beyond the influence of cross talk. A ground plane can be added either above substrate 27 or below substrate 31.

In FIG. 6, portions of four signal plane layers are shown. Conductors 32, 33 and 34 on substrate 35 and conductors 36, 37 and 38 on substrate 39 are oriented generally in the horizontal direction while conductors 42, 43 and 44 on subtrate 45 and conductors 46, 47 and 48 on substrate 49 are oriented generally in the vertical direction. As in FIG. 5, the parallel conductors are beyond any substantial influence of coupled noise from each other because of intervening orthogonal layers. However, those in immediate proximity maintain relative convergence or divergence as noted by conductor 33 and its neighbors 32, 34 on either side, and conductors 36 and 38 with respect to conductor 37 and conductors 32 and 34 on the second layer above. A ground plane, not shown, may be added either above substrate 35 or below substrate 49 if desired. It will be noted that in this multi-layer arrangement, only three conductors are parallel in either the horizontal or vertical directions and they are separated into different vertical planes with an intervening signal plane.

Figure 7:
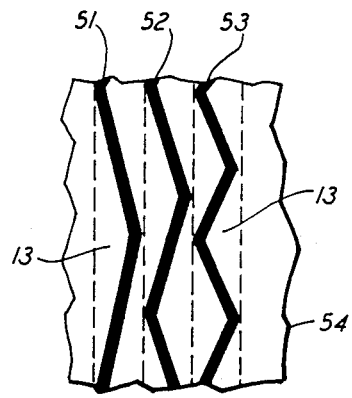
FIG. 7 illustrates conductor placement with each conductor having a progressively greater angle with respect to its assigned channel.

An alternative conductor arrangement is shown in FIG. 7 where conductors 51, 52 and 53 each converge or diverge within their respective channels 13 on substrate 54 at increasingly greater angles from left to right. For example, the angle used by conductor 51 may be six degrees, conductor 52 may be twelve degrees, and conductor 53 may be eighteen degrees. This pattern can then be repeated.

Figure 8:
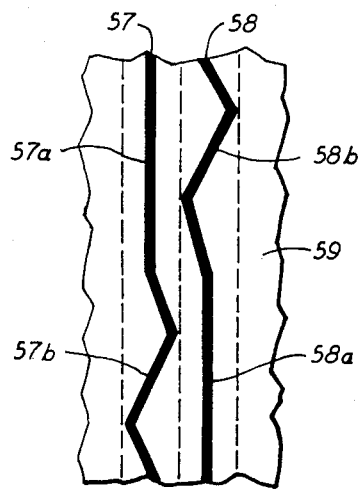
FIG. 8 shows a conductor arrangement for achieving reduced coupling and maintaining identical signal propagation time.

In FIG. 8, a technique is illustrated to insure that signal propagation time in two conductors 57 and 58 on substrate 59 is the same, when such propagation is crucial. Here, each conductor has a straight portion, such as 57a and 58a and a zig-zag portion 57b and 58b, respectively. However, the straight end zig-zag portions for each conductor equals those of the other conductor so that total path lengths are the same. This arrangement retains nonparallel conductors for reduced cross talk.

While the invention has been particularly shown and described with reference to preferred embodiments thereof, it will be understood by those skilled in the art that other changes in form and details may be made therein withot departing from the spirit and the scope of the invention.

What is claimed is:

1. A circuit panel comprising:
   at least one layer of electrically insulative material having a plurality of parallel channels designated thereon; and
   a plurality of conductors on a surface of said layer lying within a region of voltage fluctuations in said conductors induced in one or more of the conductors in said conductor plurality by changes in current flow in one or more of the other conductors in said conductor plurality wherein the longitudinal axis of each of the conductors continually either converges or diverges with respect to the axes of others in said conductor plurality while each said conductor lies within one of said plurality of parallel channels on said surface and within said region of induced voltage fluctuations.

2. The circuit panel as described in claim 1 wherein said convergence and divergence of said longitudinal axes of said conductors are at an angle of at least six degrees.

3. The circuit panel as described in claim 1 wherein said convergence and divergence of said longitudinal axes of said conductors are at an angle between six and fifteen degrees.

4. The circuit panel as described in claim 1 where in said convergence or divergence of each conductor is at an angular difference of at least six degrees or multiple thereof with respect to the others in said plurality of conductors within said region.

5. The circuit panel as described in claim 1 wherein the conductors in said conductor plurality each have the same angle of convergence or divergence in their respective said channels but each is shifted axially therein to provide relative convergence or divergence with respect to an adjacent conductor.

6. The circuit panel as described in claim 1 wherein said conductor plurality includes at least a pair of adjacent conductors each having along its length a portion parallel with its channel boundary and a portion either convergent or divergent therewith, and wherein the parallel and convergent and divergent portions of one conductor lie adjacent oppositely disposed portions of the other conductor to produce at least two conductors of identical length within a given distance.

7. The circuit panel as described in claim 1 wherein said panel comprises at least two superposed layers of insulative material and each said layer has parallel channels each having at least one conductor therein and a said plurality of conductors in said region includes conductors on both of said layers.

8. The circuit panel as described in claim 1 wherein at least one of said channels carries two or more conductors and said two or more conductors are each encased in an individually insulative coating.

9. The circuit panel as described in claim 8 wherein each of the conductors in said at least one of the channels have a plurality of segments whose longitudinal axes alternately converge and diverge with respect to the adjacent segments of another conductor.

10. The circuit panel as described in claim 1 wherein said plurality of conductors includes at least one substantially straight conductor and one conductor alternately converging and diverging with respect to said straight conductor.

11. The circuit panel as described in claim 1 wherein one of said channels includes at least two conductors each having an insulative coating and whose longitudinal axes cross each other at intervals along said channel.

12. The circuit panel as described in claim 1 wherein said panel includes at least two superposed insulative layers with the parallel channels on each of said layers being parallel with said channels on the other of said layers and the conductors in said channels maintaining relative convergence and divergence with respect to other conductors on the same or the other of said layers while in the region of induced voltage fluctuations.

13. The method of constructing a circuit panel having diminished coupled noise between active and quiet conductors comprising the steps of:
    providing an electrically insulative substrate having a plurality of parallel contiguous channels thereon for circuit conductors; and
    forming within each said channel one electrical conductor whose longitudinal axis continually either converges or diverges with respect to any other conductor in any other channel within the coupled noise region of said one conductor when operating as an energized conductor.

14. The method as described in claim 13 wherein during said forming step two or more individually insulated conductors are formed within the same channel and each conductor maintains convergence and divergence with respect to the one or more other conductors in the same channel and any other said channel within said coupled noise region.

15. The method of claim 13 wherein during said forming step said conductors are formed such that said convergece and divergence of conductor longitudinal axes lie at an angle between six and fifteen degrees with respect to the axes of other conductors within said coupled noise region.

* * * * *